United States Patent
Lin et al.

(10) Patent No.: US 8,836,094 B1
(45) Date of Patent: Sep. 16, 2014

(54) PACKAGE DEVICE INCLUDING AN OPENING IN A FLEXIBLE SUBSTRATE AND METHODS OF FORMING THE SAME

(71) Applicant: Taiwan Semiconductor Manufactuing Company, Ltd., Hsin-Chu (TW)

(72) Inventors: Tsung-Shu Lin, New Taipei (TW); Cheng-Chieh Hsieh, Yongkang District (TW); Hung-An Teng, Taoyuan (TW); Sao-Ling Chiu, Hsin-Chu (TW); Shang-Yun Hou, Jubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/828,430

(22) Filed: Mar. 14, 2013

(51) Int. Cl.
  *H01L 23/02* (2006.01)
  *H01L 23/498* (2006.01)
  *H01L 21/48* (2006.01)

(52) U.S. Cl.
  CPC ........ *H01L 23/4985* (2013.01); *H01L 21/4857* (2013.01)
  USPC ........................................................ 257/676

(58) Field of Classification Search
  CPC ......... H01L 24/10; H01L 24/75; H01L 24/02; H01L 21/563; H01L 23/538
  USPC .................................. 257/676, 738; 361/753
  See application file for complete search history.

(56) References Cited

U.S. PATENT DOCUMENTS

| | | | |
|---|---|---|---|
| 7,459,782 B1 | 12/2008 | Li | |
| 2005/0019981 A1* | 1/2005 | Wang | 438/108 |
| 2008/0070000 A1* | 3/2008 | Suzuki | 428/138 |
| 2010/0019368 A1* | 1/2010 | Shin | 257/686 |
| 2010/0193938 A1* | 8/2010 | Jobetto | 257/693 |
| 2011/0089531 A1* | 4/2011 | Hillman et al. | 257/532 |
| 2012/0043127 A1* | 2/2012 | Lin et al. | 174/266 |
| 2012/0049366 A1* | 3/2012 | Zeng | 257/738 |
| 2012/0160550 A1* | 6/2012 | Jeong et al. | 174/257 |
| 2012/0228754 A1* | 9/2012 | Liu et al. | 257/676 |
| 2013/0050967 A1* | 2/2013 | Ohshima et al. | 361/764 |
| 2013/0130494 A1* | 5/2013 | Kondo | 438/613 |

* cited by examiner

*Primary Examiner* — Nathan Ha
(74) *Attorney, Agent, or Firm* — Slater and Matsil, L.L.P.

(57) ABSTRACT

Methods and apparatus are disclosed for forming ultra-thin packages for semiconductor devices on flexible substrates. A flexible substrate may comprise a plurality of insulating layers and redistribution layers. Openings of the flexible substrate may be formed at one side of the flexible substrate, two sides of the flexible substrate, or simply cut through the flexible substrate to divide the flexible substrate into two parts. Connectors may be placed within the opening of the flexible substrate and connected to redistribution layers of the flexible substrate. Dies can be attached to the connectors and electrically connected to the connectors and to the redistribution layers of the flexible substrate. Structure supports may be placed at another side of the flexible substrate on the surface or within an opening.

19 Claims, 8 Drawing Sheets

Figure 4C

US 8,836,094 B1

PACKAGE DEVICE INCLUDING AN OPENING IN A FLEXIBLE SUBSTRATE AND METHODS OF FORMING THE SAME

BACKGROUND

Semiconductor devices are used in a variety of applications, such as personal computers, cell phones, digital cameras, and many other portable electronic equipment. These portable electronic equipments need to be small, lightweight, and produced in high volumes at relatively low cost.

Semiconductor devices such as portable electronic equipments can be divided into a simple hierarchy consisting of devices such as integrated circuit (IC) dies, packages, printed circuit boards (PCB), and systems. The package is the interface between an IC die and a PCB. IC dies are made from semiconductor materials such as silicon. Dies are then assembled into a package. The packaged die is then attached either directly to a PCB or to another substrate, which may be a second level packaging. With the increasing demand for portable electronic equipments, there is a need for the development of smaller Integrated circuit (IC) packages with reduced footprint and height.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the embodiments of the present disclosure are discussed in detail below. It should be appreciated, however, that the embodiments of the present disclosure provide many applicable concepts that can be embodied in a wide variety of specific contexts. The specific embodiments discussed are merely illustrative of specific ways to make and use the disclosure, and do not limit the scope of the disclosure.

Packages formed using flexible materials are revolutionizing the packaging industry. Current flexible packages for portable electronic equipments may suffer from shrinkage of the flexible substrate of the package and the printed circuit boards (PCB) after dies have been attached. The shrinkage of the flexible substrate and the PCB leads to unstable dies and substrate warpage problems.

Figure 1A:
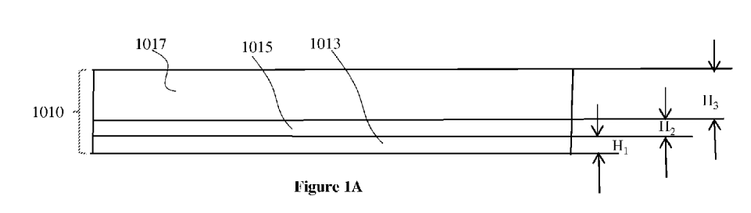
FIGS. 1A-1E illustrate in cross-sectional views and a top view a process of forming a package on a three layer flexible substrate, in accordance with some embodiments.

With reference to FIG. 1A, a flexible substrate 1010 may be provided. The flexible substrate 1010 may be used with the broadest meaning and may not be limited to a flexible substrate for a specific semiconductor package such as a chip on film (COF) package. Rather, the flexible substrate 1010 may be used in a COF package, a wafer level package (WLP), a ball grid array (BGA) package, or any other package. The flexible substrate 1010 may be used in flexible electronics, to meet the needs of flexible applications, such as wearable electronics and flexible displays. The targeted height for a package using the flexible substrate 1010 may be less than 200 um. The flexible substrate 1010 may not normally include the PCB. The flexible substrate 1010 may comprise a first insulating layer 1013, a first redistribution layer (RDL) 1015, and a second insulating layer 1017, as demonstrated in the embodiments shown in the present disclosure.

The first insulating layer 1013 may provide the primary physical and electrical properties of the flexible substrate. The first insulating layer 1013 may be made from polyimide (PI), polyester, polyethylene naphthalate (PEN), teflon, polyethylene terephthalate (PET), or other polymeric materials. The material for the first insulating layer 1013, such as the polyimide, may be formed by spin-coating, followed by curing. The first insulating layer 1013 may be of a first height $H_1$ in a range from about 15 µm to about 20 µm.

The flexible substrate 1010 further comprises a first RDL 1015 formed on the first insulating layer 1013 at a first side. While illustrated as a single layer in FIG. 1A, the first RDL 1015 comprises a plurality of conductive features isolated from each other by dielectric material in order to form various conductive connections to the connectors 1050 (described further below with respect to FIGS. 1C-1D) and route signals to and from the connectors 1050 around the flexible substrate 1010. As such, in an embodiment, the first RDL 1015 may be formed by initially placing a dielectric material and then performing, e.g., a damascene or dual damascene process to inlay conductive material such as copper using an electroplating process in a desired pattern for the first RDL 1015. Alternatively, in embodiments in which aluminum or other conductive materials (e.g., metallic alloys) are utilized, the conductive regions may be formed using a deposition process such as sputtering followed by a masking and etching process, which may then be covered by the dielectric material. Any suitable process for forming the first RDL 1015 may alternatively be utilized. The first RDL 1015 may have a second height $H_2$ in a range from about 20 µm to about 24 µm.

The flexible substrate 1010 further comprises a second insulating layer 1017 formed above the first RDL 1015. The second insulating layer 1017 may be made from polyimide (PI), polyester, polyethylene naphthalate (PEN), teflon, polyethylene terephthalate (PET), or other polymeric materials. The second insulating layer 1017 may be made of a same material or of a different material for the first insulating layer 1013. The second insulating layer 1017 may be of a third height $H_3$ in a range from about 30 µm to about 40 µm. The height of the first insulating layer 1013 and the height of the second insulating layer 1017 may be different.

The total height of the first RDL 1015 and the first insulating layer 1013 may be in a range from about 40 µm to about 44 µm. The first height $H_1$ of the first insulating layer 103 and the second height $H_2$ of the first RDL 1015 may have a ratio in a range from about 0.6 to about 1. The first height $H_1$ of the first insulating layer 103 and the third height $H_3$ of the second insulating layer 107 may have a ratio in a range from about 0.3 to about 0.7. The second height $H_2$ and the third height $H_3$ may have a ratio in a range from about 0.5 to about 0.8. All the numbers are for examples only and are not limiting. With the continuous reduction in feature sizes for semiconductor devices, it is possible the first insulating layer 1013, the first RDL 1015, and the second insulating layer 1017 may have smaller heights than described above.

Figure 1B:
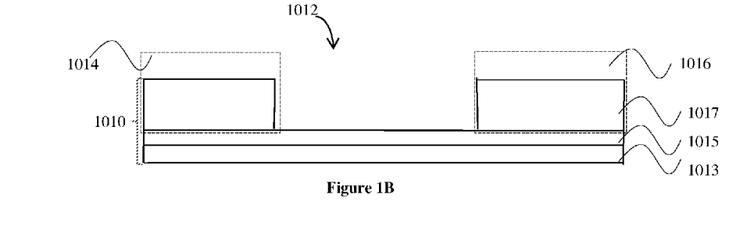

As illustrated in FIG. 1B, a first opening 1012 may be formed at the first side of the first insulating layer 1013, through the second insulating layer 1017. The first opening 1012 exposes the first RDL 1015 so that a die 1030, not illustrated in FIG. 1B but illustrated and discussed below in FIGS. 1C and 1D, may be connected to the first RDL 1015. The first opening 1012 may be formed around the middle of the flexible substrate 1010 so that a first portion 1014 and a second portion 1016 of the second insulating layer 1017 are separated by the first opening 1012 (a top-down view of which is illustrated and discussed below with respect to FIG. 1E), and so that the first portion 1014 and the second portion 1016 are of a substantially similar length. The length of the first opening 1012 may be slightly larger than a length of the die 1030 which is going to be placed within the first opening 1012.

The first opening 1012 may be formed using, e.g., photolithography techniques. In an embodiment, a photoresist material (not shown) may be deposited above the second insulating layer 1017. The photoresist material is then exposed through a mask and developed to produce a pattern, so that the photoresist material is removed in the area for the first opening 1012 to be formed. The second insulating layer 1017 and the first RDL 1015 are then removed in the first opening 1012 by etching, using the patterned photoresist material as a mask.

Figure 1C:
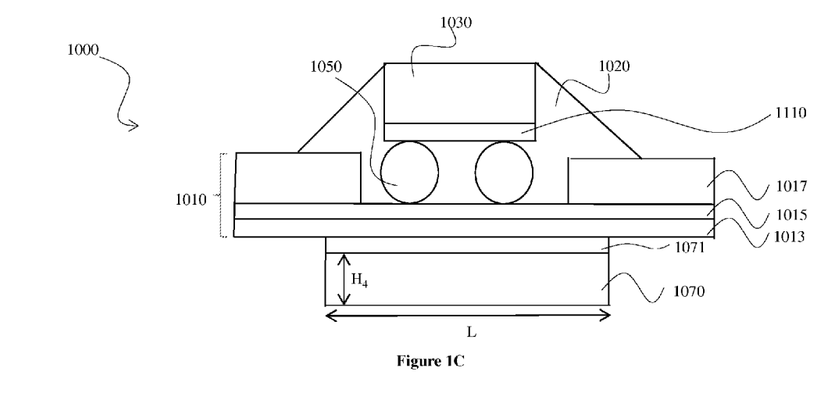
Figure 1D:
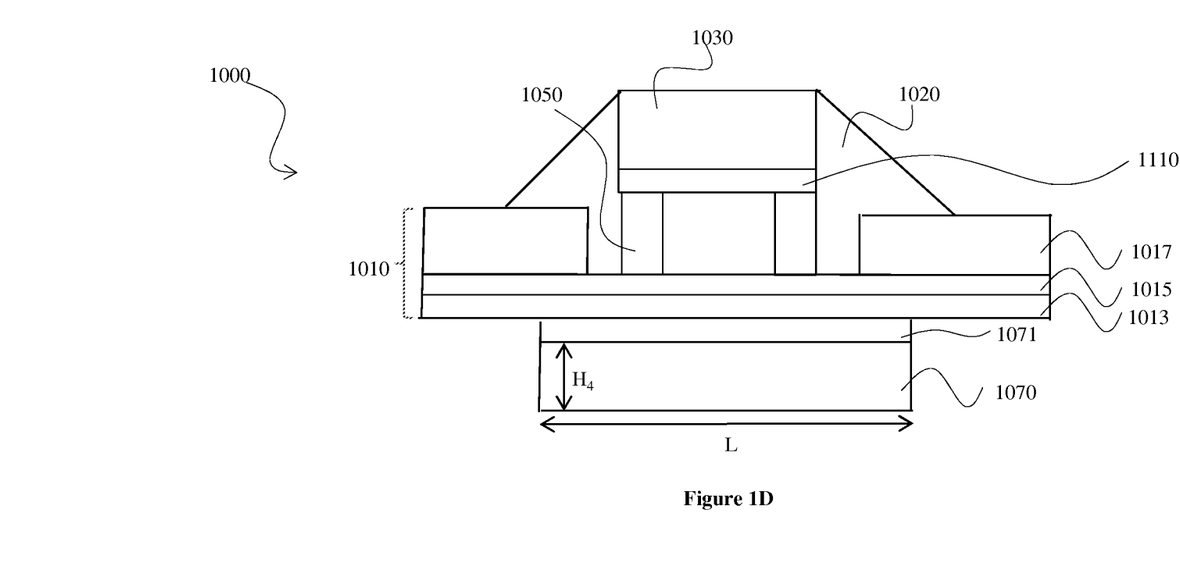

As illustrated in FIGS. 1C and 1D, the die 1030 may be placed on the flexible substrate 1010 to form a package 1000. The package 1000 comprises, in addition to the flexible substrate 1010, a connector 1050 or a plurality of connectors 1050 placed on and in contact with the first RDL 1015, within the first opening 1012 (not illustrated in FIG. 1C) of the flexible substrate 1010. The die 1030 is placed on the connectors 1050 and electrically connected to the connectors 1050. The package 1000 further comprises an underfill 1020 filling the first opening 1012 of the flexible substrate 1010, covering the connectors 1050 and the first RDL 1015. The underfill 1020 may further extend over a surface of the first portion 1014 and the second portion 1016 of the second insulating layer 1017, covering a part of the surfaces of the first portion 1014 and the second portion 1016 of the second insulating layer 1017. The package 1000 may further comprise a structure support 1070 connected to the first insulating layer 1013 at a second side opposite to the first side of the first insulating layer 1013.

The connectors 1050 may provide connections between the die 1030 and the first RDL 1015. The connectors 1050 may be contact bumps such as micro-bumps or controlled collapse chip connection (C4) bumps and may comprise a material such as tin, or other suitable materials, such as silver or copper. In an embodiment in which the connectors 1050 are tin solder balls, the connectors 1050 may be formed by initially forming a layer of tin through any suitable method such as evaporation, electroplating, printing, solder transfer, ball placement, etc. Once a layer of tin has been formed on the structure, a reflow may be performed in order to shape the material into the desired ball shape. The connectors 1050 may be of different sizes and shapes. As an example, the connectors 1050 shown in FIG. 1C may be solder balls placed on the first RDL 1015.

As another example, the connectors 1050 shown in FIG. 1D may be metal pillars or solder joints directly formed on the first RDL 1015. The metal pillars may comprise solder pillar, copper, or their alloys. The connectors 1050 may be of various shapes such as a square, or a ball. The diameter of the connector 1050 when the connector 1050 is of a ball shape, or the length of the connector 1050 when the connector 1050 is of a square shape, may be in a range of about 50 μm to about 100 μm.

The die 1030 is placed on the connectors 1050. The die 1030 may be an integrated circuit chip formed from a semiconductor wafer. The die 1030 may be any suitable integrated circuit die for a particular application. For example, the die 1030 may be a memory chip, such as a DRAM, SRAM, or NVRAM, or a logic circuit. The die 1030 may further comprise active devices, passive devices, passivation layers, insulating layers, under bump metallization (UBM) pads, which are not shown.

In an embodiment, the die 1030 may comprise a die RDL 1110, in contact with the connectors 1050 to connect the die 1030 to the first RDL 1015. The die RDL 1110 may be made with, e.g., Ti, Al, Ni, nickel vanadium (NiV), Cu, or a Cu alloy. The formation methods include electrolytic plating, electroless plating, sputtering, and the like. The die RDL 1110 can be made with a single layer, or multiple layers using an adhesion layer of Ti, TiW, or Cr, for example. The die RDL 1110 may have a height between about 2 μm and about 10 μm, for example, although the height of the die RDL 1110 is only shown for illustrative purposes and not limiting.

The underfill 1020 is placed between the die 1030 and the surface of the first RDL 1015, filling the first opening 1012, strengthening the attachment of the die 1030 to the flexible substrate 1010, and preventing the thermal stresses from breaking the connections between the die 1030 and the flexible substrate 1010. Generally, the material for the underfill 1020, such as organic resin, is selected to control the coefficient of thermal expansion and the shrinkage of underfill 1020. Initially, liquid organic resin is applied that flows into the gap between the die 1030 and the surface of the first RDL 1015, which subsequently cures to control the shrinkage that occurs in the underfill 1020 during curing.

The structure support 1070, also known as a stiffener, is connected to the first insulating layer 1013 at a second side opposite to the first side of the first insulating layer 1013. The structure support 1070 may be a flat structure having substantially a same size as a size of the die 1030, or having a bigger size than the size of the die 1030. For example, the structure support 1070 may have a bigger size than the size of the die 1030, and may have a length L in a range from about 50 μm to about 150 μm, and a fourth height $H_4$ in a range from about 20 μm to about 100 μm, although any suitable dimensions may alternatively be used. As such, the structure support 1070 may have a ratio to the first height $H_1$ or between about 1 and about 6.7, a ratio to the second height $H_2$ of between about 0.8 to about 5, a ratio to the third height $H_3$ of between about 0.5 and about 3.3.

The structure support 1070 is used to constrain the flexible substrate 1010 in order to prevent its warpage or other movement relative to the die 1030, which may be caused by thermal cycling (e.g., changes in temperature) during package assembly. Such movement may result from the different coefficients of thermal expansion of the die 1030 and the flexible substrate 1010 materials, and may produce stress in the die 1030 or the package in causing electrical and mechanical failures. A suitable structure support material may include graphite, such as natural graphite, although any suitable structure support material may be used. For example, materials containing continuous carbon fibers may be used. The structure support material may further include a metallic material. For example, copper, aluminum, or a ceramic may be used.

The structure support 1070 is connected to the first insulating layer 1013 by the adhesion layer 1071. In an embodiment the structure support 1070 is connected to the first insulating layer 1013 by an adhesion layer 1071. The adhesion layer 1071 may comprise an adhesive material such as, e.g., a glue, an epoxy, a polymer, combinations of these, or the like, and may be applied by initially applying an amount of the adhesive material to the first insulating layer 1013, placing the structure support 1070 in contact with the adhesion layer 1071, and then curing the adhesion layer 1071 in order to solidify the connection between the structure support 1070 and the first insulating layer 1013.

Figure 1E:
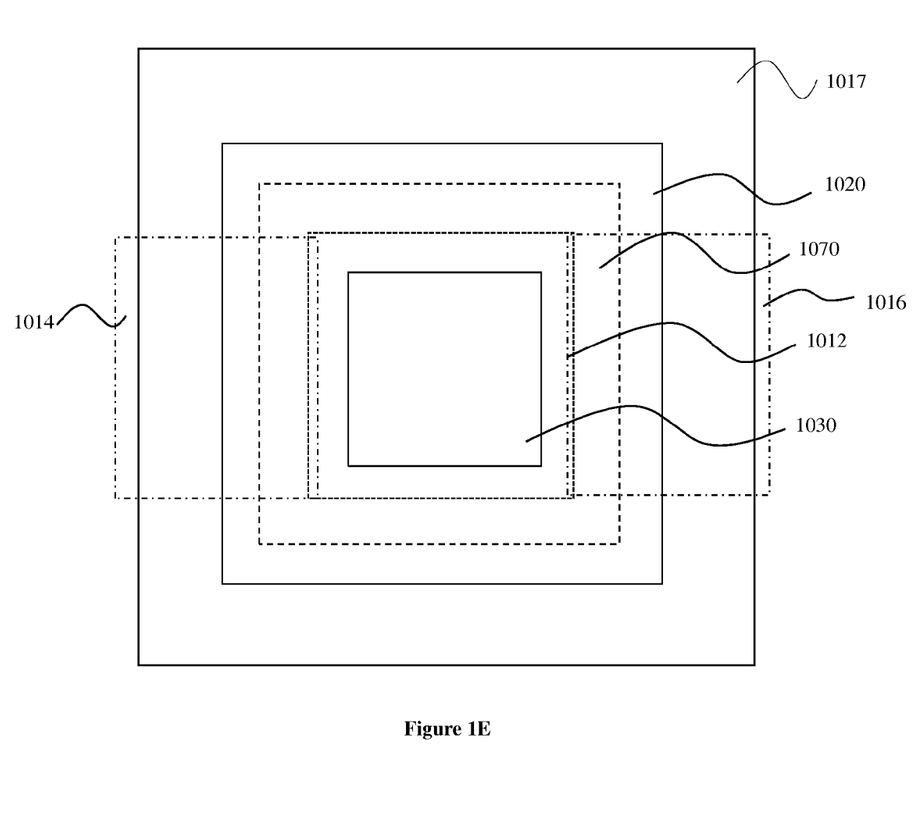

FIG. 1E illustrates a top view of the components shown in FIG. 1D. As illustrated, the first opening 1012 is formed through the second dielectric layer 1017 (although underneath the underfill 1020) to separate the first portion 1014 and the second portion 1016 of the flexible substrate 1010, although the flexible substrate 1010 may extend around the first opening 1012 above and below (in FIG. 1E) the first opening 1012. The die 1030 is placed within the first opening 1012 and the structure support 1070 is attached to the opposite side of the flexible substrate 1010 to provide additional support against thermal expansion.

Additionally, while the first opening 1012 is illustrated in FIG. 1E as being an opening through second dielectric layer 1017 to expose a portion of the first RDL 1015, this is intended to be illustrative and is not intended to be limiting. Rather, any suitable pattern for the first opening 1012, including removing portions of the second dielectric layer 1017 all the way across the substrate 1013 such that the second dielectric layer 1017 is separated into two completely different portions that are unconnected, may alternatively be utilized. All such patterns are fully intended to be included within the scope of the embodiments.

FIGS. 2A-2D illustrate in cross-sectional views a process of forming the package 1000 with a flexible substrate 1010 comprising five layers. In this embodiment, the flexible substrate 1010 has multiple RDLs, compared to only the first RDL 1015 shown in FIGS. 1A-1D. The following descriptions highlight the differences between FIGS. 2A-2D and FIGS. 1A-1D.

Figure 2A:
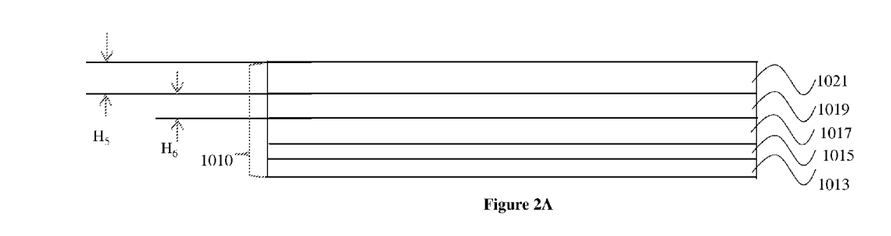
FIGS. 2A-2D illustrate in cross-sectional views a process of forming a package on a five layer flexible substrate, in accordance with some embodiments.

FIG. 2A illustrates the flexible substrate 1010 with five layers. The flexible substrate 1010 comprises the first insulating layer 1013 which is a bottom insulating layer, the first RDL 1015 formed on the first insulating layer 1013 at a first side, and the second insulating layer 1017 above the first RDL 1015. The details of the first insulating layer 1013, the first RDL 1015, and the second insulating layer 1017 are similar to the descriptions for the FIGS. 1A-1D.

The flexible substrate 1010 further comprises a second RDL 1019 above the second insulating layer 1017, followed by a third insulating layer 1021 which is also the top insulating layer on the second RDL 1019. There may be more insulating layers and RDLs formed for the flexible substrate 1010, which are not shown. The insulating layers and RDLs may be formed in an alternating fashion so that a RDL is between two insulating layers. The third insulating layer 1021 at the top surface of the flexible substrate 1010 and the first insulating layer 1013 at the bottom surface of the flexible substrate 1010 are insulating layers to provide protections to the flexible substrate 1010. The various insulating layers, such as the first insulating layer 1013, the second insulating layer 1017, and the third insulating layer 1021 may be made of a same material or of different materials. The various RDLs, such as the first RDL 1015 and the second RDL 1019 may be made of a same material or of a different material.

The heights or thicknesses of the various insulating layers and RDLs may be different. For example, the third insulating layer 1021 may be similar to the first insulating layer 1013 and may have a fifth height $H_5$ in a range from about 15 µm to about 20 µm, while the second RDL 1019 in the middle of the stack may have a sixth height $H_6$ that may be in a range from about 10 µm to about 24 µm, such as being either between 10 µm and about 12 µm (which is thinner than the bottom and the top insulating layers) or being between about 20 µm and 24 µm (similar to the first RDL 1015). As such, the second RDL 1019 may have a ratio to the first height $H_1$ of between about 0.5 and about 1.6, a ratio to the second height $H_2$ of between about 0.4 and about 1.2, a ratio to the third height $H_3$ of between about 0.25 and about 0.8, and a ratio to the fourth height $H_4$ of between about 0.1 and about 1.2. All the numbers are for examples only and are not limiting. With the continuous reduction in feature sizes for semiconductor devices, it is possible the first RDL 1015, the second RDL 1019, the first insulating layer 1013, the second insulating layer 1017, and the third insulating layer 1021, may have smaller heights than described above.

Figure 2B:
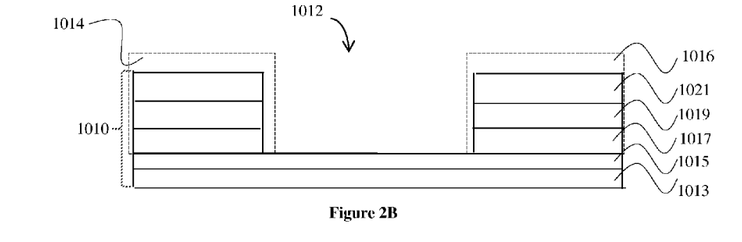
Figure 2C:
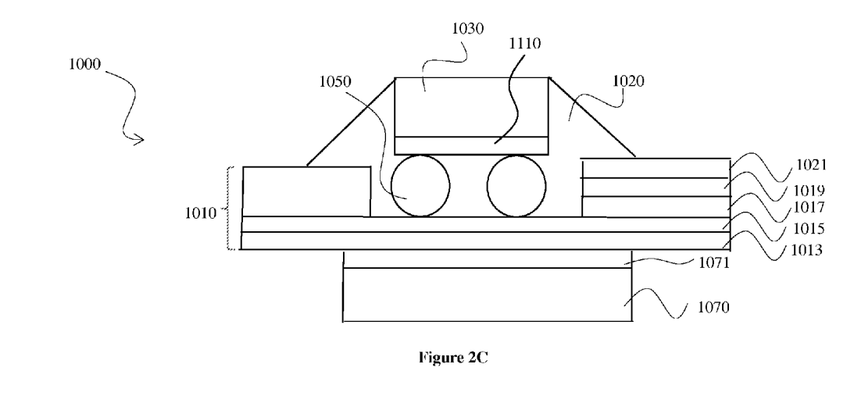
Figure 2D:
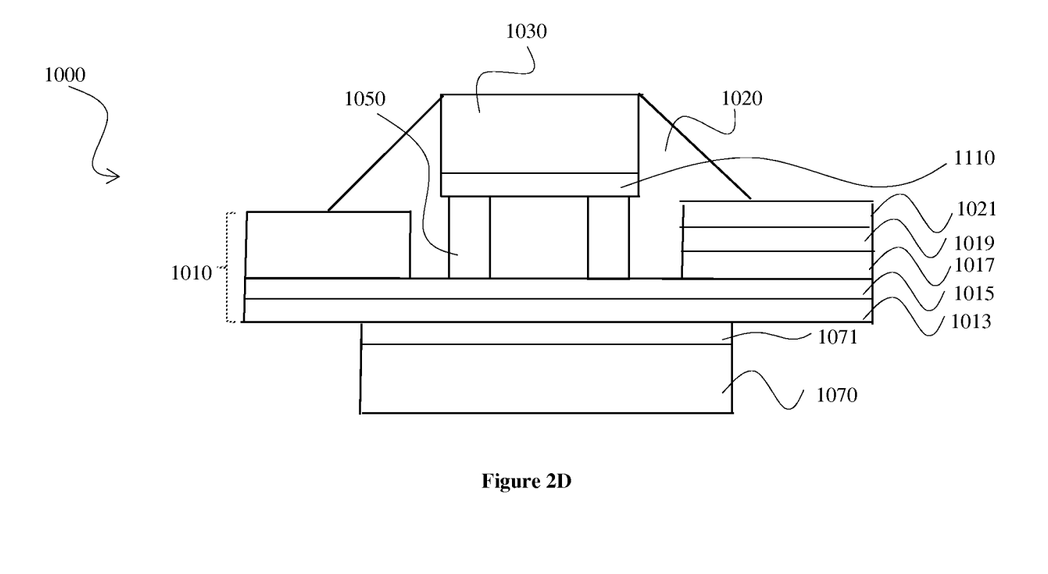

FIG. 2B illustrates the first opening 1012 of the flexible substrate 1010, formed at the first side of the first insulating layer 1013, through the second insulating layer 1017, the second RDL 1019, and the third insulating layer 1021. In this embodiment, the first opening 1012 may be formed through the plurality of insulating layers and RDLs except the first insulating layer 1013 and the first RDL 1015. The first opening 1012 exposes the first RDL 1015 so that the die 1030 may be connected to the first RDL 1015 within the first opening 1012 as shown in FIGS. 2C-2D. The first opening 1012 may be formed around the middle of the flexible substrate 1010 so that the first portion 1014 and the second portion 1016, (separated by the first opening 1012 of the second insulating layer 1017, the second RDL 1019, and the third insulating layer 1021), are of a substantially similar length. The length of the first opening 1012 may be slightly larger than a length of the die 1030 which is going to be placed within the first opening 1012.

FIGS. 2C-2D illustrate the placement of the die 1030 on the flexible substrate 1010 with five layers shown in FIG. 2A to form the package 1000 using the connector 1050 or a plurality of connectors 1050, with FIG. 2C illustrating the package 1000 formed using solder balls as the connector 1050, and FIG. 2D illustrating the package 1000 formed using metal pillars as the connector 1050. The package 1000 further comprises the die RDL 1110, the underfill 1020, the adhesion layer 1071, and the structure support 1070. The details of the connectors 1050, the die 1030, the die RDL 1110, the underfill 1020, the adhesion layer 1071, and the structure support 1070 may be similar to the description above with respect to FIGS. 1C-1D. The total height of the package 1000 shown in FIGS. 2C-2D may be in a range from about 190 µm to about 210 µm, such as 200 µm.

Having more layers of conductive materials and insulating materials can provide more structure support to the die 1030, and more flexibility as to how the conductive connections are made among the multiple RDLs. The additional layers may also enable more applications when the package 1000 may be used. The five layers shown in FIGS. 2A-2D are merely examples of multiple layers of conductive materials and insulating materials. There may be even more than five layers shown in FIGS. 2A-2D.

Figure 3A:
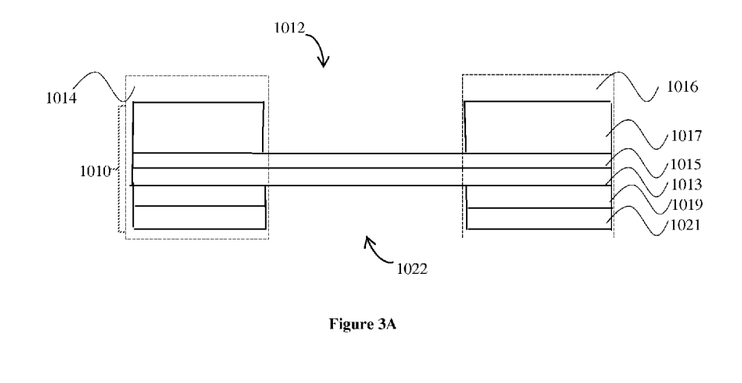
FIGS. 3A-3B illustrate in cross-sectional views a process of forming a package on a five layer flexible substrate with openings on both sides, in accordance with some additional embodiments.
Figure 3B:
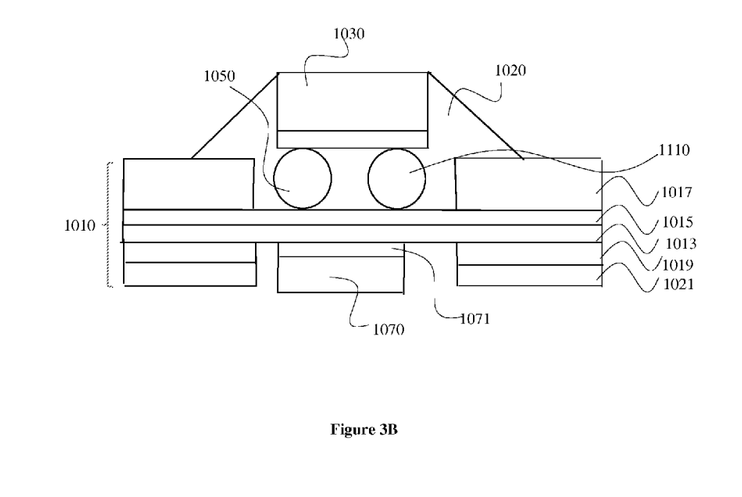

FIGS. 3A-3B illustrate in cross-sectional view yet another embodiment in which a package is formed on a five layer flexible substrate with openings on both sides. FIG. 3A illustrates the flexible substrate 1010 comprising the first insulating layer 1013, the first RDL 1015 formed on the first insulating layer 1013 at the first side, and the second insulating layer 1017 above the first RDL 1015. However, in this embodiment, the flexible substrate 1010 further comprises the second RDL 1019 next to the first insulating layer 1013 at the second side opposite to the first side of the first insulating layer 1013, and the third insulating layer 1021 next to the second RDL 1019. There may be more insulating layers and RDLs formed for the flexible substrate 1010, which are not shown. The insulating layers and RDLs may be formed in an alternating fashion so that a RDL is between two insulating layers. The first insulating layer 1013, the second insulating layer 1017, and the third insulating layer 1021 may be made of a same material or of different materials. The first RDL 1015 and the second RDL 1019 may be made of a same material or of a different material.

The flexible substrate 1010 further comprises the first opening 1012 formed at the first side of the first insulating layer 1013, through the second insulating layer 1017. The flexible substrate 1010 further comprises a second opening 1022 formed at the second side of the first insulating layer 1013 opposite to the first side, through the second RDL 1019 and the third insulating layer 1021. In general, the second opening 1022 may be formed through a plurality of insulating layers and RDLs to expose the second side of the first insulating layer 1013, although in other embodiments, the second opening 1022 may be shallower and not reach the first insulating layer 1013. The second opening 1022 provides more space where the structure support 1070 may be placed, while not increasing the overall height of the package 1000 as shown in FIG. 3B. The second opening 1022 may be formed around the middle of the flexible substrate 1010 so that the first portion 1014 and the second portion 1016 are separated by the second opening 1022 of the third insulating layer 1021 and the second RDL 1019, are of a substantially similar length. The length of the second opening 1022 may be of similar length of the first opening 1012.

As illustrated in FIG. 3B, the die 1030 may be placed on the flexible substrate 1010 to form the package 1000. The package 1000 comprises the connector 1050, the die 1030 with the die RDL 1110, and the underfill 1020 filling the first opening 1012. The details of the connectors 1050, the die 1030, the die RDL 1110, and the underfill 1020 may be similar as described above with respect to FIGS. 1A-1D and FIGS. 2A-2D.

The package 1000 may further comprise the structure support 1070 connected to the first insulating layer 1013 at a second side opposite to the first side of the first insulating layer 1013, placed within the second opening 1022 of the flexible substrate 1010. The structure support 1070 is connected to the first insulating layer 1013 by the adhesion layer 1071. The structure support 1070 may or may not fill the second opening 1022. The second opening 1022 provides more space where the structure support 1070 may be placed, while not increasing the overall height of the package 1000.

Figure 4A:
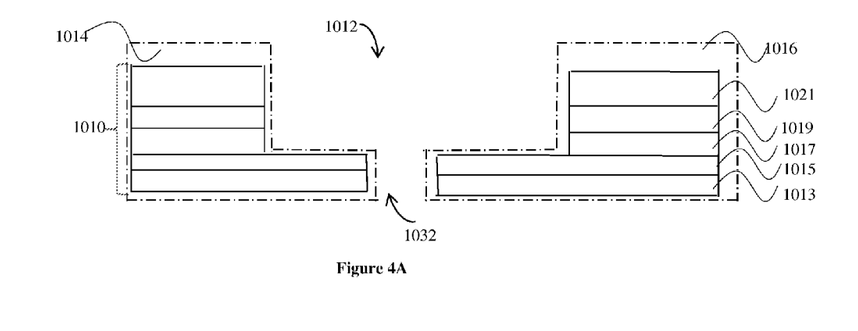
FIGS. 4A-4C illustrate in cross-sectional views a process of forming a package on a five layer flexible substrate separated into two components, in accordance with some additional embodiments.
Figure 4B:
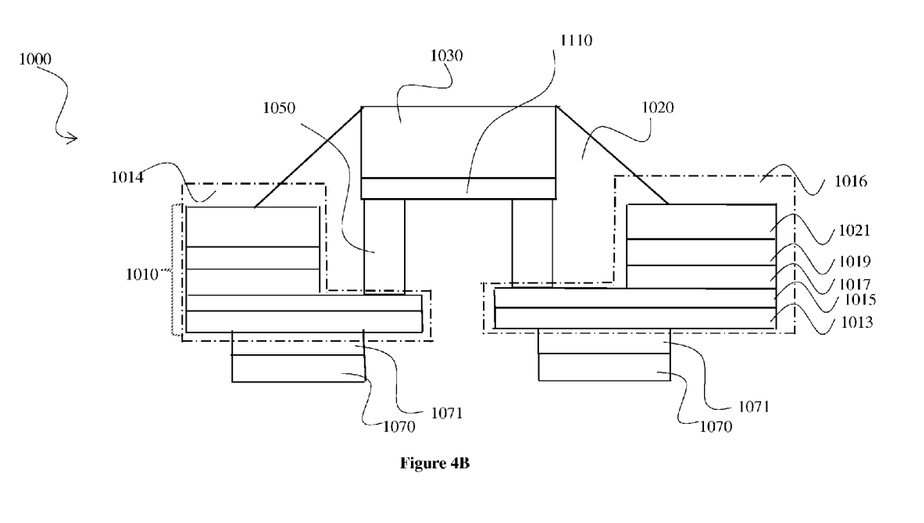
Figure 4C:
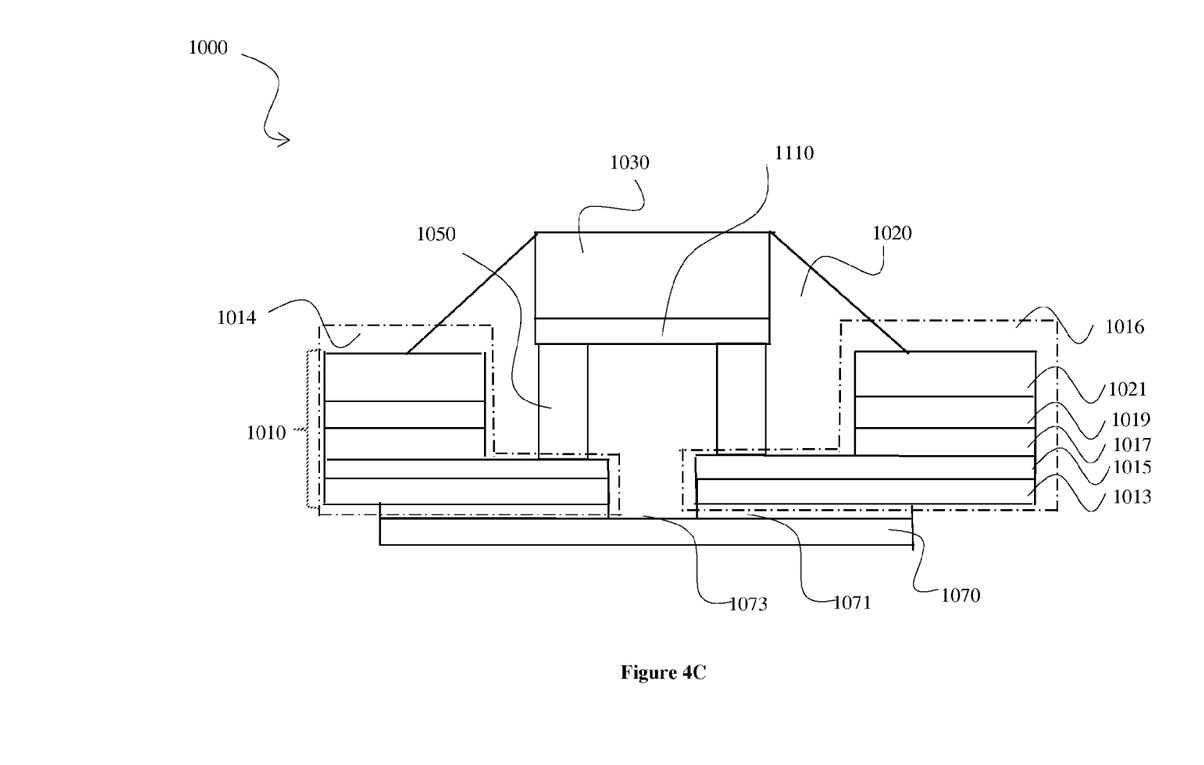

FIGS. 4A-4C illustrate in cross-sectional views a process of placing the die 1030 on the flexible substrate 1010 with five layers to form the package 1000, in accordance with some additional embodiments. In this embodiment, the flexible substrate 1010 is separated into the first portion 1014 and the second portion 1016. Similar structures may be formed for a flexible substrate 1010 with other numbers of layers such as three layers or seven layers, which are not shown.

As illustrated in FIG. 4A, the flexible substrate 1010 may comprise the first insulating layer 1013, the first RDL 1015 formed on the first insulating layer 1013 at a first side, and the second insulating layer 1017 above the first RDL 1015. The flexible substrate 1010 further comprises the second RDL 1019 above the second insulating layer 1017, and the third insulating layer 1021 above the second RDL 1019. There may be more insulating layers and RDLs formed for the flexible substrate 1010, which are not shown.

The flexible substrate 1010 may have the first opening 1012 and a third opening 1032. The first opening 1012 is through the second insulating layer 1017, the second RDL 1019, and the third insulating layer 1021. The third opening 1032 is through the first insulating layer 1013 and the first RDL 1015. The first opening 1012 and the third opening 1032 are connected and cut the flexible substrate 1010 into two completely separate portions, the first portion 1014 and the second portion 1016, which are not physically connected to each other. The third opening 1032 is narrower than the first opening 1012, such as between about 10% to about 20% narrower, therefore leaving a part of the first RDL 1015 exposed on the first portion 1014 and the second portion 1016.

In an alternative embodiment, the first opening 1012 and the third opening 1032 may be formed as openings made into the flexible substrate 1010. In this embodiment the first opening 1012 and the third opening 1032 connect to each other as openings through the flexible substrate 1010 but portions of the flexible substrate 1010 not within the first portion 1014 or the second portion 1016 may remain in contact with each other. As such, the first opening 1012 and the third opening 1032 form openings but do not fully separate the flexible substrate 1010 into separate parts.

The die 1030 with the die RDL 1110 may be placed on the flexible substrate 1010 to form the package 1000. The connector 1050 is placed on the first portion 1014, and the connector 1050 is placed on the second portion 1016. The package 1000 further comprises the underfill 1020 filling the first opening 1012. The details of the connectors 1050, the die 1030, the die RDL 1110, and the underfill 1020 may be similar as described above with respect to FIGS. 1A-1D and FIGS. 2A-2D.

The package 1000 further comprises the structure support 1070 connected to the first insulating layer 1013 at a second side opposite to the first side at the first portion 1014, and the structure support 1070 connected to the first insulating layer 1013 at a second side opposite to the first side at the second portion 1016. The structure support 1070 is connected to the first insulating layer 1013 by the adhesion layer 1071. This embodiment may provide more flexibility for the die 1030 while still providing support to the die 1030 as well.

Alternatively, as shown in FIG. 4C, the structure support 1070 may be attached so that the structure support 1070 crosses the third opening 1032. In this embodiment the adhesion layer 1071 may be initially applied to the first portion 1014 and the second portion 1016 and then the structure support 1070 may be placed on the adhesion layer 1071 such that the structure support 1070 covers the third opening 1032. Such an embodiment provides for additional support between the first portion 1014 and the second portion 1016.

Optionally if desired, a second underfill 1073 may be placed into the third opening 1032 in order to provide an additional amount of support. In an embodiment the second underfill 1073 may be similar to the underfill 1020 described above with respect to FIG. 1C, although the second underfill 1073 may alternatively be different. The second underfill 1073 may be placed into the third opening prior to the attachment of the structure support 1070 to the flexible substrate 1010.

A package device is disclosed. The package device comprises a flexible substrate having a first insulating layer, a first RDL on the first insulating layer at a first side, and a second insulating layer on the first RDL. A first opening of the flexible substrate is formed through the second insulating layer, separating the second insulating layer into a first portion and a second portion. One or more connectors are placed within the first opening of the flexible substrate and in contact with the first RDL. A die is on the one or more connectors and electrically connected to the one or more connectors.

A method for forming a package device is disclosed. The method comprises forming a first opening in a flexible substrate, wherein the flexible substrate comprises a first insulating layer, a first RDL on the first insulating layer at a first side, and a second insulating layer on the first RDL, and the first opening is through the second insulating layer. The method further places a connector within the first opening of the flexible substrate and in contact with the first RDL; and places a die on the connector and electrically connected to the connector.

A package device is disclosed. The package device comprises a flexible substrate having a first insulating layer, a first RDL on the first insulating layer at a first side, and a second insulating layer on the first RDL. A first opening of the flexible substrate is formed through the second insulating layer, separating the second insulating layer into a first portion and a second portion. A connector is placed within the first opening of the flexible substrate and in contact with the first RDL. A die on the connector and electrically connected to the connector. A structure support is connected to the first insulating layer at a second side opposite to the first side of the first insulating layer.

Although the present disclosure and its advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A package device, comprising:
    a flexible substrate, wherein the flexible substrate comprises a first insulating layer, a first redistribution layer on the first insulating layer at a first side, a second insulating layer on the first redistribution layer, a second redistribution layer on the second insulating layer, and a third insulating layer on the second redistribution layer;
    a first opening of the flexible substrate through the second insulating layer, the second redistribution layer, and the third insulating layer and separating the second insulating layer into a first portion and a second portion;
    one or more connectors placed within the first opening of the flexible substrate and in contact with the first redistribution layer; and
    a die on the one or more connectors and electrically connected to the one or more connectors.

2. The device of claim 1, further comprising an underfill material filling the first opening of the flexible substrate.

3. The device of claim 1, further comprising a structure support connected to the first insulating layer at a second side opposite to the first side of the first insulating layer.

4. The device of claim 3, wherein the structure support is of a material selected from the group consisting essentially of a graphite, a material containing continuous carbon fiber, or a metallic material.

5. The device of claim 1, wherein the die is connected to the one or more connectors by a die redistribution layer.

6. The device of claim 1, wherein the first insulating layer has a first height, the second insulating layer has a second height, a ratio of the first height and the second height is in a range from about 0.6 to about 1.

7. The device of claim 1, wherein the flexible substrate further comprises:
    a second redistribution layer next to the first insulating layer at a second side opposite to the first side of the first insulating layer;
    a third insulating layer next to the second redistribution layer, wherein the first opening of the flexible substrate through the second insulating layer at the first side of the first insulating layer; and
    a second opening of the flexible substrate through the third insulating layer and the second redistribution layer.

8. The device of claim 7, further comprising a structure support connected to the first insulating layer at the second side opposite to the first side of the first insulating layer, within the second opening of the flexible substrate.

9. The device of claim 1, wherein the first opening of the flexible substrate extends through the first insulating layer and the first redistribution layer to separate the flexible substrate into a first part and a second part, a first connector of the one or more connectors is on the first redistribution layer at the first part of the flexible substrate, a second connector of the one or more connectors is on the first redistribution layer at the second part of the flexible substrate, and the die is on the first connector and the second connector and electrically connected to the first connector and the second connector.

10. The device of claim 9, further comprising a first structure support connected to the first insulating layer at a second side opposite to the first side of the first insulating layer at the first part of the flexible substrate, and a second structure support connected to the first insulating layer at the second side opposite to the first side of the first insulating layer at the second part of the flexible substrate.

11. A method for forming a package device comprising:
    forming a first opening in a flexible substrate, wherein the flexible substrate comprises a first insulating layer, a first redistribution layer on the first insulating layer at a first side, a second insulating layer on the first redistribution layer, a second redistribution layer on the second insulating layer, and a third insulating layer on the second redistribution layer, and the first opening is through the second insulating layer, the second redistribution layer, and the third insulating layer;
    placing a connector within the first opening of the flexible substrate and in contact with the first redistribution layer; and
    placing a die on the connector and electrically connected to the connector.

12. The method of claim 11, further comprising filling the first opening of the flexible substrate with an underfill material.

13. The method of claim 12, further comprising forming a structure support connected to the first insulating layer at a second side opposite to the first side of the first insulating layer.

14. The method of claim 11, wherein the forming the first opening of the flexible substrate comprises forming the first opening through the second insulating layer, the first insulating layer, and the first redistribution layer, to separate the flexible substrate into a first part, and a second part.

15. The method of claim 14, wherein the placing the connector within the first opening of the flexible substrate comprises:
   placing a first connector on the first redistribution layer at the first part of the flexible substrate,
   placing a second connector on the first redistribution layer at the second part of the flexible substrate; and
   placing the die on the connector comprises:
   placing the die on the first connector and on the second connector, and electrically connected to the first connector and the second connector.

16. The method of claim 11, wherein the forming the first opening in the flexible substrate further comprises forming the first opening through the second insulating layer, a third insulating layer, and a second redistribution layer, wherein the flexible substrate comprises the second redistribution layer on the second insulating layer, and the third insulating layer on the second redistribution layer.

17. A package device, comprising:
   a flexible substrate, wherein the flexible substrate comprises a first insulating layer, a first redistribution layer on the first insulating layer at a first side, a second insulating layer on the first redistribution layer, and a first opening of the flexible substrate through the second insulating layer;
   a connector within the first opening of the flexible substrate and in contact with the first redistribution layer;
   a die on the connector and electrically connected to the connector; and
   a structure support connected to the first insulating layer at a second side opposite to the first side of the first insulating layer.

18. The device of claim 17, wherein the flexible substrate further comprises a second redistribution layer on the second insulating layer, a third insulating layer on the second redistribution layer, and the first opening of the flexible substrate is through the third insulating layer, the second redistribution layer, and the second insulating layer.

19. The device of claim 17, wherein the flexible substrate further comprises a second redistribution layer next to the first insulating layer at a second side opposite to the first side of the first insulating layer, a third insulating layer next to the second redistribution layer, the first opening of the flexible substrate through the second insulating layer at the first side of the first insulating layer, and a second opening of the flexible substrate through the third insulating layer and the second redistribution layer.

* * * * *